United States Patent
Wu et al.

(10) Patent No.: US 9,837,553 B1
(45) Date of Patent: Dec. 5, 2017

(54) VERTICAL FIELD EFFECT TRANSISTOR

(71) Applicant: GLOBALFOUNDRIES INC., Grand Cayman (KY)

(72) Inventors: Xusheng Wu, Ballston Lake, NY (US); John H. Zhang, Ballston Lake, NY (US); Haigou Huang, Rexford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/282,415

(22) Filed: Sep. 30, 2016

(51) Int. Cl.
*H01L 29/786* (2006.01)
*H01L 29/423* (2006.01)
*H01L 29/66* (2006.01)

(52) U.S. Cl.
CPC .. *H01L 29/78696* (2013.01); *H01L 29/42392* (2013.01); *H01L 29/66666* (2013.01); *H01L 29/78618* (2013.01); *H01L 29/78642* (2013.01)

(58) Field of Classification Search
CPC ............. H01L 29/4236; H01L 29/7851; H01L 29/66628; H01L 29/66795
See application file for complete search history.

(56) References Cited

U.S. PATENT DOCUMENTS

| 9,142,640 | B1* | 9/2015 | Wu | H01L 29/66545 |
| 2015/0243652 | A1* | 8/2015 | Joshi | H01L 27/088 257/392 |
| 2017/0077270 | A1* | 3/2017 | Liu | H01L 27/098 |

* cited by examiner

*Primary Examiner* — Kyoung Lee
*Assistant Examiner* — Christina Sylvia
(74) *Attorney, Agent, or Firm* — Francois Pagette; Andrew M. Calderon; Roberts Mlotkowski Safran Cole & Calderon, P.C.

(57) ABSTRACT

The present disclosure relates to semiconductor structures and, more particularly, to vertical field effect transistors (VFETs) and methods of manufacture. The VFET includes: one or more vertical fin structures; a source region positioned at a first location on a top surface of the one or more vertical fin structures; a drain region positioned at a second location on the top surface of the one or more vertical fin structures at a predetermined distance away from the source region, along a length thereof; and a gate channel along the predetermined distance and in electrical contact with the source region and the drain region.

16 Claims, 4 Drawing Sheets

→ Current flow

VERTICAL FIELD EFFECT TRANSISTOR

FIELD OF THE INVENTION

The present disclosure relates to semiconductor structures and, more particularly, to vertical field effect transistors (VFETs) and methods of manufacture.

BACKGROUND

In Vertical FET (VFET) technologies, the height of the fin portion of the VFET is used as a channel region, where a source region is formed on the base, on a lower portion of the fin structure, and a drain region is formed on a top portion of the fin structure (or vice versa). The height of the fin structure is fixed because the gate channel defines the process. Accordingly, the height (e.g., width) of the VFET will dictate the channel length of the device, as current flow will be along a height of the VFET. For example, in VFET technologies, the type of device, e.g., long channel devices (e.g., gate length >100 nm), medium channel device (e.g., gate length of about 30 nm to 80 nm), "Wimpy" device (e.g., gate length of about 15 nm to 20 nm), etc., is dictated by the fin height.

In order to change the type of device in VFET technologies, the formation of the fin, e.g., height, needs to be adjusted. Although it is possible to change the height of the device based on the technology node, e.g., channel length, it is impractical if not impossible to form different types of devices on a single chip. This is due to the complexity of trying to alter the heights of different fins on the same chip. The cost and manufacturing time would significantly increase, while yield would significantly decrease.

SUMMARY

In an aspect of the disclosure, a device includes: one or more vertical fin structures; a source region positioned at a first location on a top surface of the one or more vertical fin structures; a drain region positioned at a second location on the top surface of the one or more vertical fin structures at a predetermined distance away from the source region, along a length thereof; and a gate channel along the predetermined distance and in electrical contact with the source region and the drain region.

In an aspect of the disclosure, a device includes: a first vertical fin structure having a gate channel of a first length oriented along length of the first fin structure; and a second vertical fin structure having a gate channel of a second length oriented along a length of the second fin structure and which is different than the first length.

In an aspect of the disclosure, a method includes: forming at least one vertical fin structure on a substrate; forming a source region on a top surface of the at least one vertical fin structure; forming a drain region on the top surface of the at least one vertical fin structure at a predetermined distance away from the source region, along a length thereof; and isolating electrically isolating the source region and the drain region on the top surface within the predetermined distance.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to vertical field effect transistors (VFETs) and methods of manufacture. More specifically, the present disclosure relates to VFETs with tailored gate channels along a length of the fin structures. For example, in embodiments, the VFETs can be tailored as long channel devices (e.g., gate length >100 nm), medium channel devices (e.g., gate length of about 20 nm to 100 nm), "Wimpy" devices (e.g., gate length of about 10 nm to 20 nm) and/or other devices (e.g., thick oxide devices with gate lengths of approximately 100 nm to 500 nm) on a single chip using process flows compatible with conventional VFET fabrication processes. Moreover, the VFETs described herein can be used for 5 nm and beyond technologies.

The VFET of the present disclosure can be manufactured in a number of ways using a number of different tools. In general, though, the methodologies and tools are used to form structures with dimensions in the micrometer and nanometer scale. The methodologies, i.e., technologies, employed to manufacture the VFET of the present disclosure have been adopted from integrated circuit (IC) technology. For example, the structures are built on wafers and are realized in films of material patterned by photolithographic processes on the top of a wafer. In particular, the fabrication of the VFET uses three basic building blocks: (i) deposition of thin films of material on a substrate, (ii) applying a patterned mask on top of the films by photolithographic imaging, and (iii) etching the films selectively to the mask.

Figure 1:
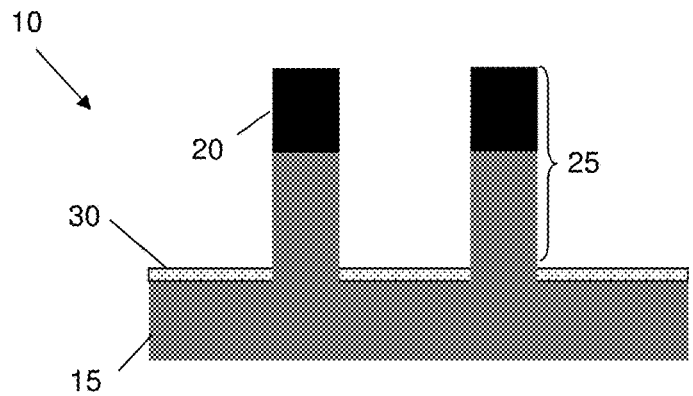
FIG. 1 shows fin structures and respective fabrication processes in accordance with aspects of the present disclosure.

FIG. 1 shows fin structures and respective fabrication processes in accordance with aspects of the present disclosure. More specifically, the structure 10 of FIG. 1 includes one or more fin structures 25 which are composed of substrate material 15 and a hardmask 20. The fin structures 25 are preferably of a same height due to fabrication processes. In embodiments, the substrate material 15 can be BULK Si, although other materials are also contemplated herein. For example, the substrate material 15 can be SiGe, SiGeC, SiC, GaAs, InAs, InP, and other compound semiconductors depending on the particular application. In embodiments, the hardmask 20 can be SiN material deposited by any conventional deposition process such as a chemical vapor deposition (CVD) process, prior to the formation of the fin structure 25.

In embodiments, the fin structures 25 are formed by conventional sidewall image transfer (SIT) techniques. In an example of a SIT technique, a mandrel material, e.g., $SiO_2$, is deposited on the hardmask 20 using conventional CVD processes. A resist is formed on the mandrel material, and exposed to light (energy) to form a pattern (openings). A reactive ion etching (RIE) is performed through the openings to form the mandrels. In embodiments, the mandrels can have different widths and/or spacing depending on the desired dimensions between the fin structures 25. Spacers are formed on the sidewalls of the mandrels which are preferably material that is different than the mandrels, and which are formed using conventional deposition processes known to those of skill in the art. The spacers can have a width which matches the dimensions of the fin structures 25. The mandrels are removed or stripped using a conventional etching process, selective to the mandrel material. An etching is then performed within the spacing of the spacers to form the sub-lithographic features. The sidewall spacers can then be stripped.

Still referring to FIG. 1, an oxide material 30 is formed between the fin structures 25, on a horizontal surface of the substrate 15. In embodiments, the oxide material 30 is a flowable oxide material which can have a thickness of about 10 nm to about 100 nm; although other dimensions are also contemplated herein.

Figure 2:
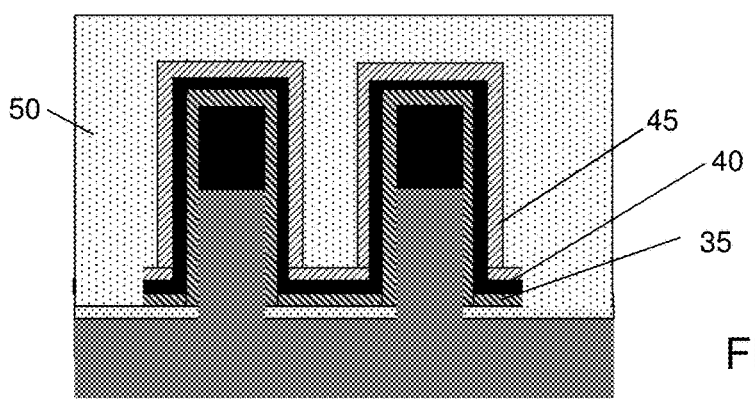
FIG. 2 shows several material layers on the fin structures and respective fabrication processes in accordance with aspects of the present disclosure.

In FIG. 2, several layers are formed over the fin structures 25 and the oxide material 30. For example, a high-k dielectric 35 is formed on the fin structures 25 and the oxide material 30. In embodiments, the high-k dielectric material 35 is a gate dielectric of, e.g., a hafnium oxide based material. The high-k dielectric material 35 can be deposited using an atomic layer deposition (ALD) process to a thickness of about 1 Å to about 100 Å, depending on the technology and design parameters. A work function metal 40 is deposited on the high-k dielectric material 35. For example, the work function metal 40 can be tungsten; although other metals are also contemplated herein. A hardmask 45, e.g., SiN, is deposited on the work function metal 40.

Still referring to FIG. 2, the high-k dielectric material 35, work function metal 40 and hardmask 45 can be patterned on the sides of the fin structure 25 using conventional lithography and etching processes known to those of skill in the art. An oxide material 50 can be formed over the patterned the high-k dielectric material 35, work function metal 40 and hardmask 45. In embodiments, the oxide material 50 can be formed by conventional ALD processes, as one example.

Figure 3:
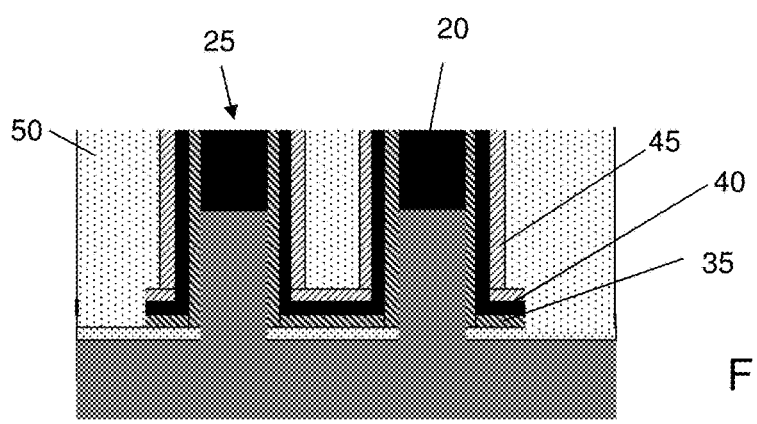
FIG. 3 shows a planarized structure and respective fabrication processes in accordance with aspects of the present disclosure.

As shown in FIG. 3, the structure of FIG. 2 undergoes a planarization process in accordance with aspects of the present disclosure. More specifically, the high-k dielectric material 35, work function metal 40, hardmask 45 and the oxide material 50 can be planarized to expose the hardmask material 20 of the fin structures 25. In embodiments, the planarization process can be performed by a conventional chemical mechanical polishing (CMP) process.

Figure 4:
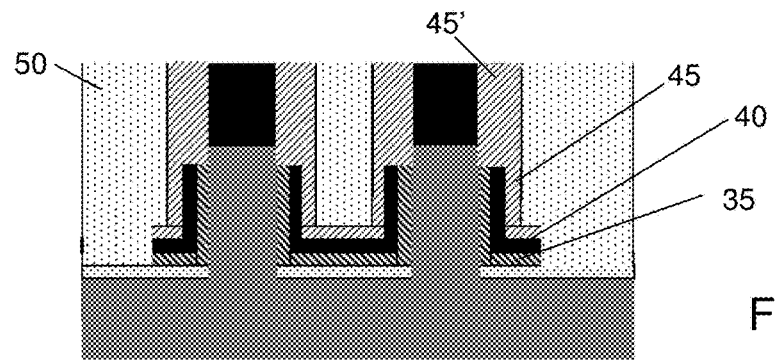
FIG. 4 shows recessed high-k dielectric material and work function metal on sides of a hardmask material and respective fabrication processes in accordance with aspects of the present disclosure.

As shown in FIG. 4, the high-k dielectric material 35 and work function metal 40 can be recessed on sides of the hardmask material 20 by conventional etching processes, e.g., reactive ion etching (RIE), selective to the material of the high-k dielectric material 35 and work function metal 40. A hardmask material 45' can be formed within the recess, following by a CMP process. In embodiments, the hardmask material 45' can be deposited using a conventional deposition process, e.g., CVD. The hardmask material 45' can be SiN, for example.

Figure 5:
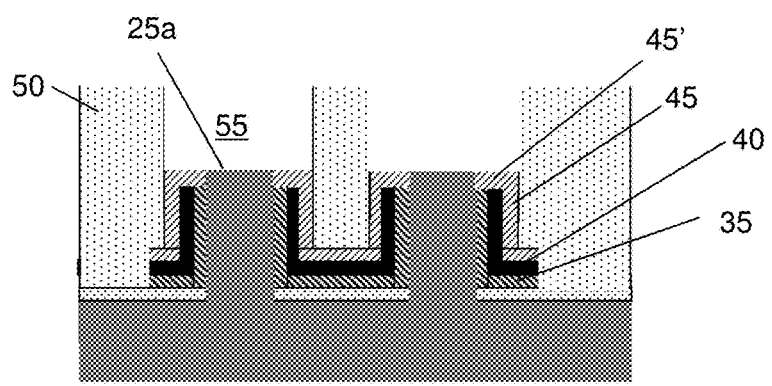
FIG. 5 shows a recess formed to expose a surface of the fin structures and respective fabrication processes in accordance with aspects of the present disclosure.

In FIG. 5, the hardmask 20 and portions of the hardmask material 45' and hardmask material 45 are removed using conventional etching processes, e.g., reactive ion etching (RIE), selective to the materials. In this way, a recess 55 is formed, exposing a surface 25a of the fin structures 25. That is, the recess 55 will expose the substrate material 15 forming the fin structures 25.

Figure 6A:
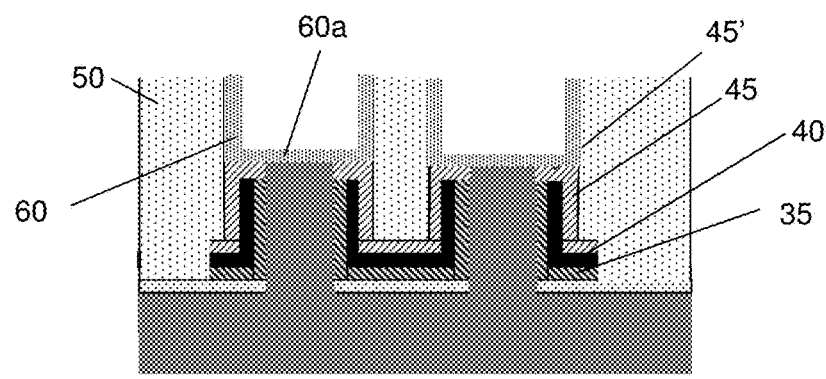
FIGS. 6A-6C show various views of the structure after additional fabrication processing in accordance with aspects of the present disclosure.
Figure 6B:
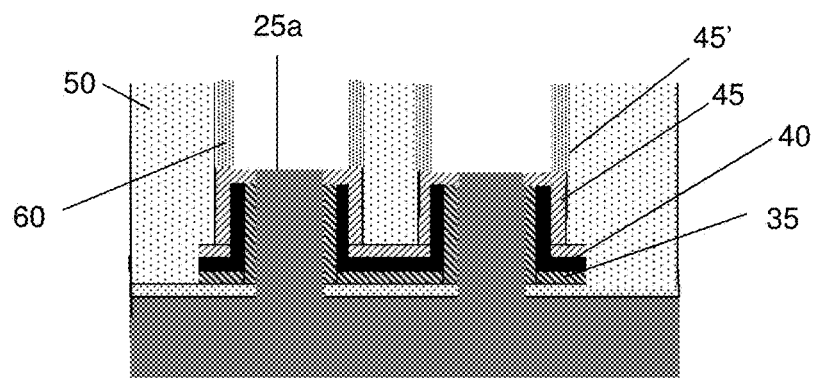
Figure 6C:
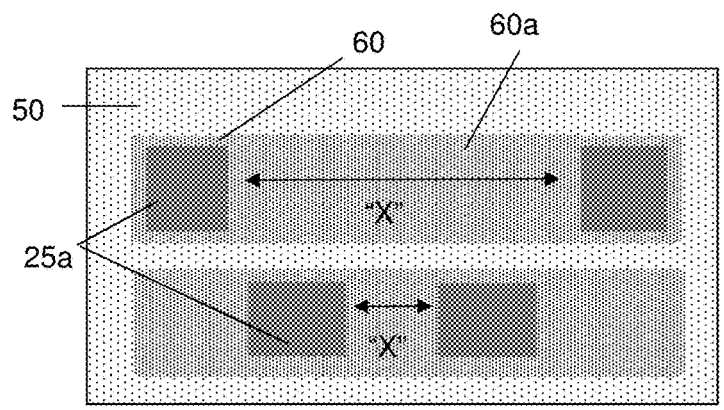

FIGS. 6A-6C show various views of the structure after additional fabrication processing in accordance with aspects of the present disclosure. For example, FIG. 6A shows a side cut-away view of a first portion along the gate length of the fin structures 25; whereas, FIG. 6B shows a side cut-away view of a second portion along the gate length of the fin structures 25, and FIG. 6C shows a top view of both FIGS. 6A and 6B.

More specifically, as shown in FIGS. 6A-6C, a spacer material is formed on the sidewalls and bottom surface of the recess 55, as designated by reference numerals 60 and 60a, respectively. In embodiments, the spacer material is a nitride material, e.g., SiN, formed by conventional deposition processes, e.g., CVD. The spacer material 60a on the bottom surface of the recess 55 is selectively removed at certain locations along the length of the fin structure 25 to expose the surface 25a of the fin structures 25. For example, in embodiments, the spacer material 60a on the bottom surface of the recess 55 can be selectively removed at a distance of greater than, e.g., 100 nm, 20 nm to 100 nm, 10 nm to 20 nm and 100 nm to 500 nm.

In embodiments, the spacer material 60a can be removed by conventional lithography and etching processes. For example, a resist can be formed over the spacer material 60a and exposed to energy to form openings at certain distances "X" along the fin structures 25. The spacer material 60a can then be removed by a reactive ion etching process to expose the surface 25a of the fin structure 25. The resist can then be removed by a conventional oxygen ashing process or other stripants.

As shown in FIG. 6C, the exposed surfaces 25a of the fin structure 25 will then be at a distance "X", which can be representative of any desired gate channel length. In fact, as shown in FIG. 6C, distance "X" is two different lengths for the fin structures 25a. In this way, it is now possible to tailor a gate channel for a vertical fin (VFET) along the length of the fin structure as shown by distance "X".

Figure 7A:
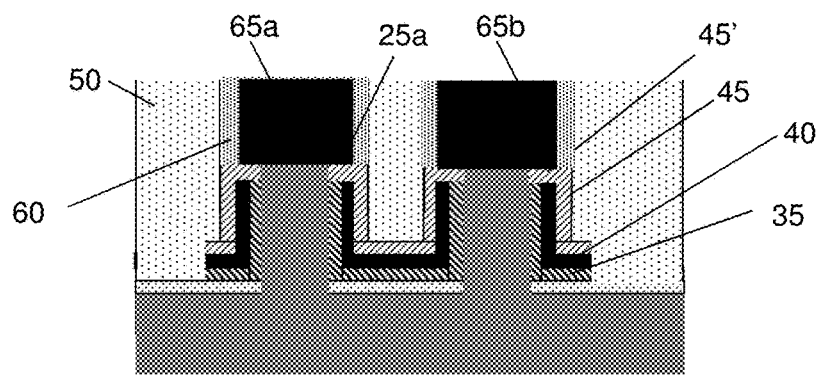
FIGS. 7A-7C show various views of source and drain regions after additional fabrication processing in accordance with aspects of the present disclosure.
Figure 7B:
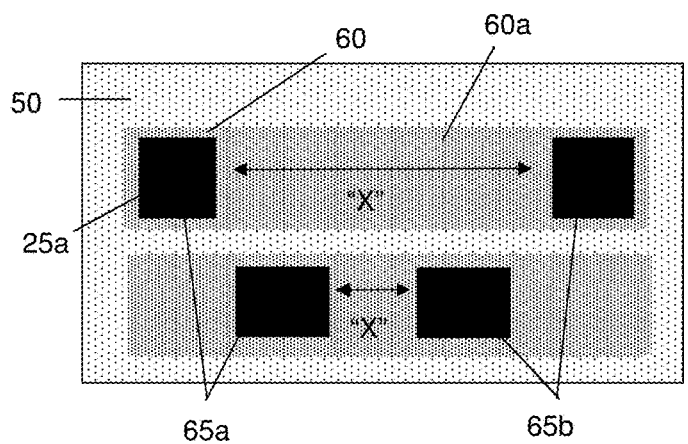
Figure 7C:
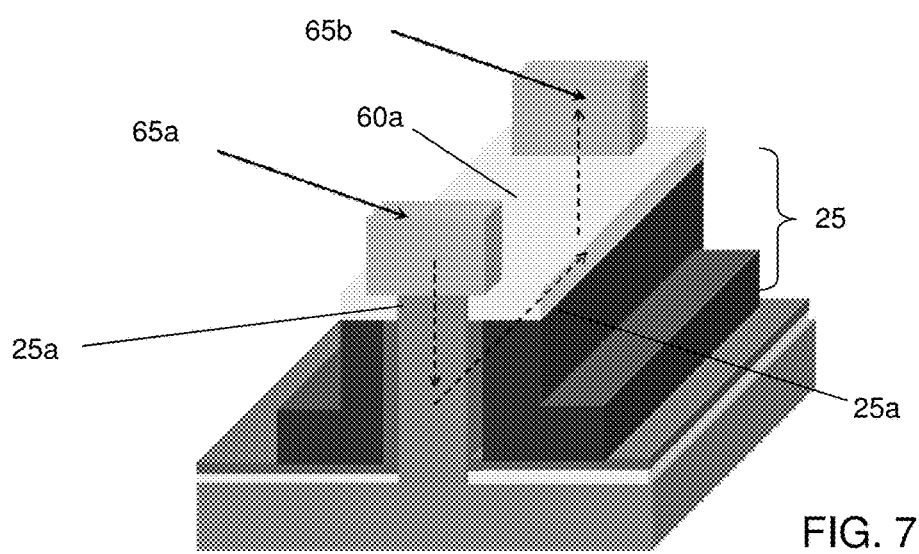

FIGS. 7A-7C show various views of the structure after additional fabrication processing in accordance with aspects of the present disclosure. For example, FIG. 7A shows a side cut-away view of a first portion along the gate length; whereas, FIG. 7B shows a top view of FIG. 7A and FIG. 7C shows an enlarged and partially cut-away view of both FIGS. 7A and 7B.

More specifically, as shown in FIGS. 7A-7C, an epitaxial material is grown on the exposed surfaces 25a of the fin structure 25, formed in the processes described with respect to FIGS. 6A-6C. In embodiments, the epitaxial material can be, e.g., Si, SiGe, SiGeC, SiC, GaAs, InAs, InP, and other compound semiconductors. Also, in embodiments, the epitaxial material can contain in-situ doping, such as SiGe with in-situ doped B, Si or SiC with in-situ doped P. In embodiments, the epitaxial material forms a source region 65a and drain region 65b both of which are in direct electrical contact with the exposed surfaces 25a on the top the fin structures 25. As should be understood by those of skill in the art, the epitaxial material will not grow on the remaining spacer material 60a on the bottom of the recess. In this way, the source region 65a and drain region 65b will be electrically isolated.

As already described herein, in this way, it is now possible to tailor a gate channel for a vertical fin (VFET) at any distance "X" along its length. For example, in embodiments, the epitaxial source region 65a and drain region 65b can form a long channel device (e.g., gate length >100 nm), medium channel device (e.g., gate length of about 20 to 100 nm), "Wimpy" device (e.g., gate length of about 10 to 20 nm) and/or other devices (e.g., thick oxide devices with gate lengths of approximately 100 nm to 500 nm). This is representatively shown in FIG. 7C, as the distance "X" is different lengths for the source region 65a and drain region 65b on two fin structures 25a. And, as representatively shown in FIG. 7C, the current flow is now from the source region 65a and drain region 65b, along the length of the fin structure 25.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A device, comprising:
   one or more vertical fin structures;
   a source region positioned at a first location on a top surface of the one or more vertical fin structures;
   a drain region positioned at a second location on the top surface of the one or more vertical fin structures at a predetermined distance away from the source region, along a length thereof;
   a gate channel along the predetermined distance and in electrical contact with the source region and the drain region; and
   insulator material on the top surface of the one or more vertical fin structures, which isolates the source region from the drain region.

2. The device of claim 1, wherein the source region and the drain region are epitaxial grown material.

3. The device of claim 2, wherein the epitaxial grown material is an in-situ doped semiconductor material.

4. The device of claim 2, wherein the epitaxial grown material is in a recess of oxide material surrounding the one or more vertical fin structure.

5. The device of claim 1, wherein the insulator material is on sidewalls of the source region and the drain region.

6. The device of claim 1, further comprising a second source region and a second drain region formed on a top surface and in electrical contact with another of the one or more vertical fin structures, the second source region and the second drain region being at a different distance than the predetermined distance between the source region and the drain region.

7. The device of claim 6, wherein the different distance is a gate channel along a length of the another of the one or more vertical fin structures, which is different than a length of the gate channel of the one or more vertical fin structures.

8. The device of claim 1, wherein the one or more fin structures comprise semiconductor material.

9. A device, comprising:
   a first vertical fin structure having a gate channel of a first length oriented along a length of the first fin structure;
   a second vertical fin structure having a gate channel of a second length oriented along a length of the second fin structure and which is different than the first length;
   a first source region positioned on a top surface of the first vertical fin structure and in electrical contact with gate channel of the first length;
   a first drain region positioned on the top surface of the first vertical fin structure at a predetermined distance away from the first source region, along a length thereof;
   a second source region positioned on a top surface of the second vertical fin structure and in electrical contact with gate channel of the second length;
   a second drain region positioned on the top surface of the second vertical fin structure at a predetermined distance away from the second source region, along a length thereof; and
   insulator material on the top surface of the first and second vertical fin structures, which isolates the first source region from the first drain region and isolates the second source region from the second drain region,
   wherein the first and second source regions and the first and second drain regions are epitaxial grown material.

10. The device of claim 9, wherein the epitaxial grown material is in-situ doped semiconductor material in a recess of oxide material on a top of the first and second vertical fin structures.

11. The device of claim 9, wherein the insulator material is on sidewalls of the first and second source regions and the first and second drain regions.

12. The device of claim 9, wherein the first and second fin structures comprise semiconductor material.

13. The device of claim 9, wherein a flow of current is along a length of the first fin structure between the first source region and the first drain region and along a length of the second fin structure between the second source region and the second drain region.

14. The device of claim 13, wherein the first fin structure and the second fin structure have a same height.

15. A method, comprising:
   forming at least one vertical fin structure;
   forming a source region on a top surface of the at least one vertical fin structure;
   forming a drain region on the top surface of the at least one vertical fin structure at a predetermined distance away from the source region, along a length thereof; and depositing insulator material on the top surface of the at least one vertical fin structure, which electrically isolates the source region and the drain region on the top surface within the predetermined distance.

16. The method of claim 15, wherein the source region and the drain region are formed by exposing two isolated portions of the top surface of the at least one vertical fin structure to expose semiconductor material and epitaxially growing material on the exposed semiconductor material.

* * * * *